US008884511B2

(12) United States Patent
Gibson et al.

(10) Patent No.: US 8,884,511 B2
(45) Date of Patent: Nov. 11, 2014

(54) LUMINESCENT MATERIALS HAVING NANOCRYSTALS EXHIBITING MULTI-MODAL ENERGY LEVEL DISTRIBUTIONS

(75) Inventors: Gary A. Gibson, Palo Alto, CA (US); Xia Sheng, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2366 days.

(21) Appl. No.: 11/483,479

(22) Filed: Jul. 10, 2006

(65) Prior Publication Data
US 2008/0007156 A1 Jan. 10, 2008

(51) Int. Cl.
| | | |
|---|---|---|
| H05B 33/14 | (2006.01) | |
| C09K 11/02 | (2006.01) | |
| H01L 51/50 | (2006.01) | |
| B82Y 30/00 | (2011.01) | |
| B82Y 20/00 | (2011.01) | |
| H01L 51/00 | (2006.01) | |

(52) U.S. Cl.
CPC ............ *H05B 33/14* (2013.01); *G02F 2202/36* (2013.01); *C09K 11/025* (2013.01); *H01L 51/5036* (2013.01); *H01L 51/5048* (2013.01); *H01L 51/0038* (2013.01); *H01L 51/502* (2013.01); *C09K 11/02* (2013.01); *B82Y 30/00* (2013.01); *H01L 51/0039* (2013.01); *B82Y 20/00* (2013.01)
USPC .......................................... 313/503; 313/504

(58) Field of Classification Search
USPC .............. 313/503, 504, 502, 501; 257/88, 89, 257/98–100; 428/690
See application file for complete search history.

(56) References Cited

U.S. PATENT DOCUMENTS

| | | | |
|---|---|---|---|
| 6,395,328 B1 | 5/2002 | May | |
| 6,445,489 B1 | 9/2002 | Jacobson et al. | |
| 6,501,091 B1 * | 12/2002 | Bawendi et al. | ................ 257/14 |
| 6,670,052 B2 | 12/2003 | Hirose et al. | |
| 6,803,129 B2 | 10/2004 | Lin et al. | |
| 6,803,719 B1 * | 10/2004 | Miller et al. | .................. 313/501 |
| 6,822,257 B2 | 11/2004 | Lee et al. | |
| 6,882,383 B1 | 4/2005 | Su | |
| 6,906,340 B2 | 6/2005 | Leung et al. | |
| 6,924,503 B2 | 8/2005 | Cheng et al. | |
| 6,924,504 B2 | 8/2005 | Humbs et al. | |
| 7,326,908 B2 * | 2/2008 | Sargent et al. | ............. 250/214.1 |
| 7,358,101 B2 * | 4/2008 | Yang et al. | ...................... 438/21 |
| 2004/0232826 A1 | 11/2004 | Liu et al. | |
| 2004/0245912 A1 | 12/2004 | Thurk et al. | |
| 2005/0069726 A1 | 3/2005 | Douglas et al. | |

(Continued)

OTHER PUBLICATIONS

Adam, Mihai Sorin, Dissertation—Spectroscopic investigation of deposited InP nanocrystals and small Cu clusters, pp. 1-127, plus Abstract, Table of Contents, and Acknowledgments, 2004.

(Continued)

*Primary Examiner* — Anh Mai
*Assistant Examiner* — Zachary J Snyder

(57) ABSTRACT

Luminescent materials include a plurality of nanocrystals. At least some of the nanocrystals may be configured to emit electromagnetic radiation upon stimulation, and the plurality of nanocrystals may exhibit a multi-modal energy level distribution. The distribution of the nanocrystals may be selectively configured to enhance the luminescence efficiency of a fraction of the plurality of nanocrystals that exhibits one energy level mode of the multi-modal energy level distribution. Light-emitting diodes and electronic devices include such luminescent materials.

16 Claims, 7 Drawing Sheets

(56) References Cited

U.S. PATENT DOCUMENTS

2005/0238915 A1 10/2005 Li et al.
2006/0066210 A1 3/2006 Ng et al.
2006/0083694 A1* 4/2006 Kodas et al. .................. 424/46

OTHER PUBLICATIONS

Battaglia,, David, et al., "Formation of High Quality InP and InAs Nanocrystals in a Noncoordinating Solvent," Nano Lett., vol. 2, No. 9, pp. 1027-1030, 2002.

Buckley, A.R., et al., "Energy transfer dynamics in polyfluorene-based polymer blends," Chemical Physics Letters 339, pp. 331-336, 2001.

Chang, Tung-Wah Frederick, et al., "High near-infrared photoluminescence quantum efficiency from PbS nanocrystals in polymer films," Synthetic Metals 148, pp. 257-261, 2005.

Coe, Seth, et al., "Electroluminescence from single monolayers of nanocrystals in molecular organic devices," Nature, vol. 420, pp. 800-803, Dec. 19-26, 2002.

Colvin, V.L., et al., "Light-emitting diodes made from cadmium selenide nanocrystals and a semiconducting polymer," Nature, vol. 370, pp. 354-357, Aug. 4, 1994.

Dabbousi, B.O., et al., "Electroluminescence from CdSe quantum-dot/polymer composites," Appl. Phys. Lett., vol. 66, No. 11, pp. 1316-1318, Mar. 13, 1995.

Dexter, D.L., "A Theory of Sensitized Luminescence in Solids," J. Chem. Phys., vol. 21, pp. 836-850, 1953.

EviDots™, EviDot Emission and Absorption Spectra/Quantum Dot Emission and Absorption Spectra, www.evidenttech.com, 6 pages, © 2003-2006 Evident Technologies.

EviDots™, EviDot Specifications/Quantum Dot Specifications, www.evidenttech.com, 2 pages, © 2003-2006 Evident Technologies.

Förster, Th., "Transfer Mechanisms of Electronic Excitation," Discussions of the Faraday Society, $10^{th}$ Spiers Memorial Lecture, vol. 27, pp. 7-17, 1959.

Förster, Th., "Zwischenmolekulare Energiewanderung und Fluoreszenz," Ann. Physik. 6, pp. 55-75, 1948.

Greenham, N.C., et al., "Charge separation and transport in conjugated-polymer/semiconductor-nanocrystal composites studied by photoluminescence quenching and photoconductivity," Physical Review B, vol. 54, No. 24, pp. 17628-17637, Dec. 15, 1996.

Klimov, V.I., et al., "Quantization of Multiparticle Auger Rates in Semiconductor Quantum Dots," Science, vol. 287, pp. 1011-1013, Feb. 11, 2000.

Lee, Jinwook, et al., "Full Color Emission from II-VI Semiconductor Quantum Dot-Polymer Compsites," Adv. Mater., vol. 12, No. 15, pp. 1102-1105, Aug. 2, 2000.

Schlamp, M.C., "Improved efficiencies in light emitting diodes made with CdSe(CdS) core/shell type nanocrystals and a semiconducting polymer," J. Appl. Phys., vol. 82, No. 11, pp. 5837-5842, Dec. 1, 1997.

Scholes, G.D., "Long-Range Resonance Energy Transfer in Molecular Systems," Annu. Rev. Phys. Chem., vol. 54, pp. 57-87, 2003.

Shevchenko, Elena V., et al., "Structural diversity in binary nanoparticle superlattices," Nature, vol. 439, pp. 55-59, Jan. 5, 2006.

Sims, Marc, et al., "Understanding the Origin of the 535 nm Emission Band in Oxidized Poly(9,9-dioctylfluorene): The Essential Role of Inter-Chain/Inter-Segment Interactions," Adv. Funct. Mater., vol. 14, No. 8, pp. 765-781, Aug. 2004.

Steckel, Jonathan S., et al., "1.3 µm to 1.55 µm Tunable Electroluminescence from PbSe Quantum Dots Embedded within an Organic Device," Adv. Mater., vol. 15, No. 21, pp. 1862-1866, Nov. 4, 2003.

* cited by examiner

LUMINESCENT MATERIALS HAVING NANOCRYSTALS EXHIBITING MULTI-MODAL ENERGY LEVEL DISTRIBUTIONS

FIELD OF THE INVENTION

The present invention relates to luminescent materials (including electroluminescent materials and photoluminescent materials), luminescent devices such as, for example, light-emitting diodes, and electronic devices including luminescent materials or luminescent devices. More particularly, the present invention relates to luminescent materials that include luminescent nanocrystals dispersed throughout a material, to organic light-emitting diodes (OLED's) including such materials, and to electronic devices that include such luminescent materials or OLED's. The present invention further relates to methods for enhancing the luminescence efficiency of luminescent materials that include nanocrystals.

BACKGROUND OF THE INVENTION

Display devices are used to display graphical images in electronic devices including, for example, televisions, computer monitors, laptop computers, handheld computers, portable DVD players, digital music players, and other portable electronic devices. Furthermore, televisions and monitors that include flat-panel display devices have replaced conventional cathode ray tube (CRT) display devices in recent years due, at least in part, to their decreased dimensions and weight.

Various types of flat-panel display devices are known in the art. Such flat-panel display devices include, for example, plasma display panels (PDP), liquid crystal displays (LCD), electro-luminescent displays, vacuum fluorescent displays, field emission displays (FED), electro-chromic displays, light-emitting diode (LED) displays, and organic light-emitting diode (OLED) displays.

OLED display devices exhibit several desirable characteristics including, for example, relatively low power consumption, low operating temperature, easy of fabrication, low production cost, quick response, and full coloration. These characteristics have led to increased interest and research in OLED display devices.

OLED display devices typically include an ordered array or matrix (e.g., rows and columns) of pixels, each of which includes at least one OLED. Each OLED typically includes an anode, a cathode, and one or more organic luminescent materials disposed between the anode and the cathode. The organic luminescent material is configured to emit electromagnetic radiation having wavelengths in the visible region of the electromagnetic spectrum (i.e., light) when an electric field is applied between the anode and the cathode. For example, an OLED display device may include a matrix of OLED's, one third of which are configured to emit red light, one third of which are configured to emit green light, and one third of which are configured to emit blue light. By selectively illuminating the different red, green, and blue OLED's in the matrix, a color image may be displayed by the OLED display device that is visible to the human eye. Various organic luminescent materials for use in OLED's have been presented in the art for use in red, green, and blue OLED's.

OLED display devices are often classified as either a small molecule OLED (SM-OLED) or as a polymer light-emitting diode display (PLED), depending on the nature of the organic luminescent material used in the light-emitting diodes of the display device.

Recently, it has been proposed to introduce nanocrystals comprising semiconductor materials into the organic luminescent material of OLED's. Such an OLED may be referred to as an "NC-OLED". This effort, however, has been met with limited success.

BRIEF SUMMARY OF THE INVENTION

In one aspect, the present invention includes a luminescent material that includes a plurality of nanocrystals having an average particle size of less than about twenty nanometers dispersed throughout a material. At least some of the nanocrystals may be configured to emit electromagnetic radiation upon stimulation. The plurality of nanocrystals may exhibit a multi-modal energy level distribution. Moreover, the distribution of the nanocrystals in the material may be selectively configured to enhance the luminescence efficiency of a fraction of the plurality of nanocrystals that exhibits one energy level mode of the multi-modal energy level distribution.

In another aspect, the present invention includes an electronic device having at least one light-emitting diode. The light-emitting diode includes an anode, a cathode, and a luminescent material disposed between at least a portion of the anode and at least a portion of the cathode. The luminescent material is configured to emit electromagnetic radiation therefrom in response to an electric field generated between the anode and the cathode. The luminescent material includes a plurality of nanocrystals, which may have an average particle size of less than about twenty nanometers dispersed throughout a polymer material. At least some of the nanocrystals may be configured to emit electromagnetic radiation upon stimulation. The plurality of nanocrystals may exhibit a multi-modal energy level distribution. Furthermore, the distribution of the nanocrystals in the polymer material may be selectively configured to enhance the luminescence efficiency of a fraction of the plurality of nanocrystals that exhibits one energy level mode of the multi-modal energy level distribution.

In yet another aspect, the present invention includes a method of enhancing the luminescence efficiency of a light-emitting diode. The method includes providing a plurality of high energy nanocrystals and a plurality of low energy nanocrystals, dispersing the plurality of high energy nanocrystals and the plurality of low energy nanocrystals throughout a polymer material for use in a light-emitting diode, and selectively tailoring the relative concentrations of the high energy nanocrystals and the low energy nanocrystals in the polymer material to enhance a luminescence efficiency of the low energy nanocrystals.

The features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
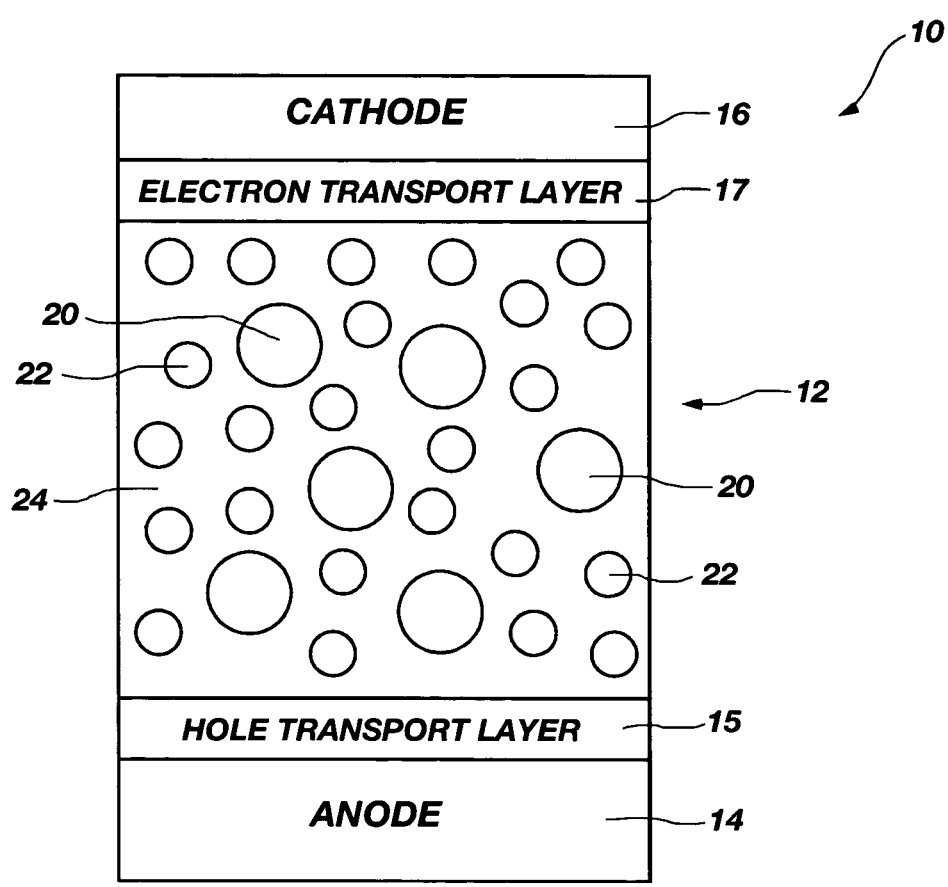
FIG. 1 is a schematic diagram of an embodiment of a light-emitting diode that includes a luminescent material and that embodies teachings of the present invention.

As used herein, the term "nanoparitcle" means a particle of matter that has cross-sectional dimensions of less than about 100 nanometers. The term "nanocrystal" means a nanoparticle that has a generally crystalline atomic structure. The term "luminescent nanocrystal" means a nanocrystal that is capable of emitting electromagnetic radiation upon stimulation. The term "luminescence efficiency" means the ratio of the power emitted from a luminescent material as electromagnetic radiation in a desired range of wavelengths to the power applied to the luminescent material to stimulate luminescence. The power applied to the luminescent material may be applied by, for example, electrical stimulation or optical pumping.

As used herein, the term "high energy nanocrystal" is a relative term meaning a nanocrystal that exhibits a bandgap energy that is higher relative to a "low energy nanocrystal." The term "low energy nanocrystal" is a relative term meaning a nanocrystal that exhibits a bandgap energy that is lower relative to a "high energy nanocrystal."

As used herein, the term "III-V type semiconductor material" means any material that comprises primarily an element or elements from group IIIB of the periodic table (B, Al, Ga, In, and Ti) and an element or elements from group VB of the periodic table (N, P, As, Sb, and Bi). The term "II-VI type semiconductor material" means any material that comprises primarily an element or elements from group IIB of the periodic table (Zn, Cd, and Hg) and an element or elements from group VIB of the periodic table (O, S, Se, Te, and Po).

As previously discussed herein, it has been suggested in the art that nanocrystals be incorporated into organic luminescent materials for use in electronic devices such as, for example, OLED devices. In such OLED devices, the nanocrystals may be the desired primary light-emitting component of the OLED device.

Light is emitted from an OLED device when electron-hole pairs, which are referred to as excitons, in the organic luminescent material of the OLED recombine and emit a photon of electromagnetic radiation in the process of recombination (i.e., radiatively recombine). Excitons may be generated in the organic luminescent material of an OLED device by applying an electric field across the organic luminescent material between an anode and a cathode.

Prior to recombination, the electrons may be disposed in the relatively higher energy conduction band of the organic luminescent material, and the holes may be disposed in the relatively lower energy valence band of the organic luminescent material. When an electron and a hole in a semiconductor material (organic or inorganic) bind to form an exciton, there may be a small reduction in the energy of the exciton (often referred to as "the binding energy"), due to Coulombic interaction between the electron and the hole. As the electrons fall from a higher energy state in the conduction band to a lower energy state in the valence band, energy may be released in the form of a photon of electromagnetic radiation (e.g., light). The difference between the energy level of the electron in the conduction band and the energy level of the hole in the valence band, less the binding energy, at least partly determines the wavelength of the photon of electromagnetic radiation emitted by the OLED.

When luminescent nanocrystals are introduced into the organic material of an OLED, excitons generated in the organic material may be transferred to the nanocrystals. If the electron-hole pairs of the excitons recombine in the nanocrystals, light may be emitted from the nanocrystals. As the energy level structure of the nanocrystals may differ from the energy level structure of the surrounding organic material, the nanocrystals may be capable of emitting electromagnetic radiation having wavelengths different from any wavelengths of electromagnetic radiation emitted by the surrounding organic material. In such composite luminescent materials, the nanocrystals may be the primary light-emitting component of the luminescent material.

To provide adequate luminescence efficiency of such an OLED device, it may be necessary to closely space the nanocrystals within the surrounding organic material. It has been observed, however, that as the concentration of the nanocrystals in an organic material of an OLED device is increased, the luminescence efficiency of the OLED device may increase until the concentration of the nanocrystals in the organic material reaches a threshold level. As the concentration of the nanocrystals in the organic material is increased beyond the threshold level, the luminescent efficiency may decrease.

While the cause of this decrease in luminescent efficiency is not fully understood, it is believed to be due, at least in part, to non-radiative resonant energy exchange of excitons between adjacent nanocrystals in the organic material. Various forms of non-radiative resonant energy transfer have been described in the academic literature including, for example, Förster energy transfer (T. Förster, Ann. Phys. 6, 55 (1948); T. Förster, Transfer Mechanisms of Electronic Excitation, Discussions of the Faraday Society, Vol. 27, Pages 7-17 (1959)) and Dexter energy transfer (D. L. Dexter, J. Chem. Phys., Vol. 21, Pages 836-50 (1953). Another reference that generally discusses resonant energy transfer is G. D. Scholes, Long-Range Resonance Energy Transfer in Molecular Systems, Annu. Rev. Phys. Chem., Vol. 54, Pages 57-87 (2003).

A limited number of "bad" nanocrystals in an organic luminescent material of an OLED device may have defects, trapped charges, or other features or characteristics that may promote the non-radiative recombination of the electron-hole pairs of excitons. It is believed that as the concentration of the nanocrystals in an organic material increases beyond the previously described threshold level, the rate of Förster exchange (and possibly other forms of non-radiative resonant energy exchange) of excitons between nanocrystals also increases. Therefore, the probability that any given exciton will encounter a bad nanocrystal before the exciton radiatively recombines may increase, the overall rate of undesirable non-radiative recombination may be increased and the rate of desirable radiative recombination decreased.

An illustrative light-emitting diode 10 that embodies teachings of the present invention is shown schematically in FIG. 1. As seen therein, the light-emitting diode 10 may have a generally multi-layered structure. For example, the light-emitting diode 10 may include a luminescent material 12 disposed between an anode 14 and a cathode 16. The luminescent material 12 may be configured to emit electromagnetic radiation having one or more wavelengths within the visible region of the electromagnetic spectrum (e.g., between about 400 nanometers and about 750 nanometers) upon stimulation. The luminescent material 12 may be stimulated by applying a voltage between the anode 14 and the cathode 16, thereby generating an electric field extending across the luminescent material 12 therebetween.

The electrical field between the anode 14 and the cathode 16 may generate excitons (i.e., electron-hole pairs) in the luminescent material 12. As the electron-hole pairs of the excitons recombine, a photon of electromagnetic radiation may be emitted having energy (i.e., a wavelength or frequency) substantially defined by the difference between the relatively higher energy level of the electron and the relatively lower energy level of the hole immediately prior to recombination, less the binding energy of the exciton.

By way of example and not limitation, the anode 14 may include a layer of transparent indium tin oxide (ITO), zinc tin oxide (ZTO), gold, platinum, carbon nanotube containing polymers, and other high work function materials. By way of example and not limitation, the cathode 16 may include a layer of aluminum, barium, calcium, lithium fluoride, and other low work function materials. Various other materials that can be used to form the anode 14 and the cathode 16 are known in the art, and any such materials may be used to provide the anode 14 and the cathode 16 of the light-emitting diode 10.

Optionally, the light-emitting diode 10 may include a hole transport layer 15 configured to facilitate the transfer of holes from the anode 14 into the luminescent material 12. Furthermore, the light-emitting diode 10 may include an electron transport layer 17 configured to facilitate the transfer of electrons from the cathode 16 into the luminescent material 12. Such hole transport layers 15 and electron transport layers 17 are known in the art. By way of example and not limitation, the hole transport layer 15 may include a layer of a poly (phenylene vinylene) (PPV) derivative material (such as, for example, cyano-substituted PPV or poly[2-methoxy-5-(2'-ethyl-hexyloxy)-1,4-phenylene vinylene] (MEH-PPV)), and the electron transport layer 17 may include, for example, a layer of tris(8-hydroxyquinolinato)aluminum (Alq3), a layer of copper phthalocyanine (CuPc), or a layer of 3-phenyl-4-~18-naphthyl!-5-phenyl-1,2,4-triazole (TAZ).

Moreover, many other material layers for enhancing the efficiency of light-emitting diodes optionally may be provided in the light-emitting diode 10. Such material layers may include, for example, hole-injecting layers (e.g., layers of poly(3,4-ethylenedioxythiophene)poly(styrenesulfonate) (PEDOT-PSS)) disposed between the anode 14 and the hole transport layer 15, and electron-injecting layers disposed between the cathode 16 and the electron transport layer 17.

As shown in FIG. 1, the luminescent material 12 may include a plurality of nanocrystals 20, 22 dispersed throughout a material 24. By way of example, the material 24 may be an organic material. Furthermore, the material 24 may be a polymer material. By way of example and not limitation, the material 24 may include a conductive polymer such as poly (9,9-dioctylfluorenyl-2,7-diyl) or a poly(phenylene vinylene) derivative, such as, for example, poly[2-methoxy-5-(2'-ethylhexyloxy)-1,4-phenylenevinylene] (MEH-PPV).

In additional embodiments, at least one of the hole transport layer 15 and the electron transport layer 17 also may include a plurality of nanocrystals 20, 22. Furthermore, in such embodiments, at least one of the hole transport layer 15 and the electron transport layer 17 also may include a luminescent material, and the light-emitting diode 10 may not include a discrete additional layer of luminescent material 12 between the hole transport layer 15 and the electron transport layer 17.

With continued reference to FIG. 1, the plurality of nanocrystals 20, 22 may exhibit a multi-modal energy level distribution, as discussed in further detail below. By way of example and not limitation, the plurality of nanocrystals 20, 22 may include a first plurality of nanocrystals 20 and a second plurality of nanocrystals 22. Each nanocrystal 20 of the first plurality of nanocrystals 20 may exhibit a substantially similar energy level structure (relative to other nanocrystals 20), and each nanocrystal 22 of the second plurality of nanocrystals 22 may exhibit a substantially similar energy level structure (relative to other nanocrystals 22) that differs from the energy level structure of the nanocrystals 20.

Figure 2A:
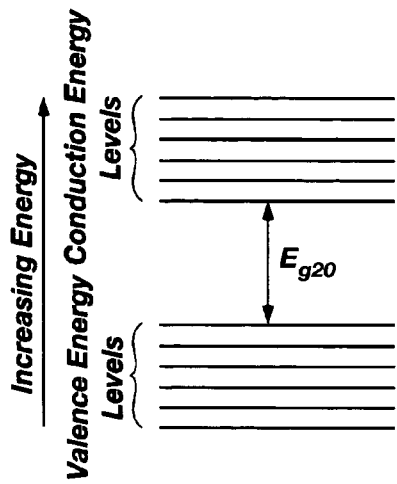
FIGS. 2A-2B represent relative energy level structures that may be exhibited by exemplary nanocrystals in the luminescent material shown in FIG. 1.
Figure 2B:
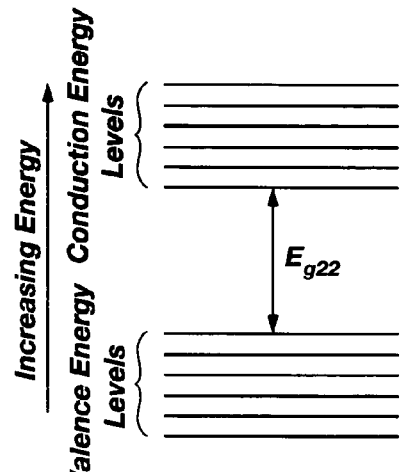

For example, the nanocrystals 20 may exhibit an energy level structure as generally represented in FIG. 2A. As seen therein, the nanocrystals 20 may have an energy level structure that includes a set of valence energy levels, a set of conduction energy levels, and that exhibits an effective bandgap energy $E_{g20}$. Similarly, the nanocrystals 22 may exhibit an energy level structure as generally represented in FIG. 2B. As seen therein, the nanocrystals 22 may have an energy level structure that includes a set of valence energy levels, a set of conduction energy levels, and that exhibits an effective bandgap energy $E_{g22}$. As used herein, the term "bandgap energy" means the difference in energy between the lowest energy level of the conduction energy levels and the highest energy level of the valence energy levels. As can be seen by comparison between FIGS. 2A and 2B, the bandgap energy $E_{g22}$ exhibited by the nanocrystals 22 may be greater than the bandgap energy $E_{g20}$ exhibited by the nanocrystals 20. In other words, the nanocrystals 20 may exhibit lower bandgap energy relative to the nanocrystals 22.

The valence energy levels of the nanocrystals 20, 22 correspond to the energy levels of the valence band of the bulk material of the nanocrystals 20, 22. The valence energy levels are those levels that are typically populated by electrons in the ground state. The conduction energy levels are those levels that are typically not populated by electrons in the ground state. In excited states, excited electrons may be disposed in conduction energy levels, and holes may be disposed in the valence energy levels.

There are many ways in which the bandgap energy of at least one of the nanocrystals 20 and the nanocrystals 22 may be configured, such that the nanocrystals 20 exhibit lower bandgap energy than the nanocrystals 22. As the size of a nanoparticle is decreased below the Bohr radius of the excitons in the nanoparticle, changes in particle size may alter the energy level structure (including the bandgap energy) of the nanoparticle. The Bohr radius of the excitons is material dependent, and is generally less than about thirty nanometers, but more typically less than about twenty nanometers. Therefore, for example, the nanocrystals 22 may have an average particle size that is smaller than an average particle size of the nanocrystals 20, as shown in FIG. 1. By way of example and not limitation, the nanocrystals 20 and the nanocrystals 22 may be generally spherical and may have an average diameter that is less than about thirty nanometers. More particularly, the nanocrystals 20 and the nanocrystals 22 may have an average diameter that is less than about twenty nanometers. Furthermore, the nanocrystals 22 may have an average diameter that is smaller than an average diameter of the nanocrystals 20 by between about 0.5 nanometers and about 5 nanometers.

In other embodiments, the nanocrystals 20 and the nanocrystals 22 may have substantially similar particle sizes. In such embodiments, the bandgap energy of at least one of the plurality of nanocrystals 20 and the plurality of nanocrystals 22 may be configured such that the nanocrystals 20 exhibit lower bandgap energy than the nanocrystals 22 by altering the chemical composition of at least one of the plurality of nanocrystals 20 and the plurality of nanocrystals 22. For example, the nanocrystals 20 or the nanocrystals 22 may be doped with impurity atoms such that the energy level structure thereof is altered. Furthermore, if at least one of the nanocrystals 20 and the nanocrystals 22 comprise an alloy (two or more elements) the composition of the alloy may be varied such that the energy level structure and the bandgap energy is altered.

In other embodiments, the nanocrystals 20 and the nanocrystals 22 may have substantially similar particle sizes and substantially similar chemical compositions. In such embodiments, the bandgap energy of at least one of the plurality of nanocrystals 20 and the plurality of nanocrystals 22 may be configured such that the nanocrystals 20 exhibit a lower bandgap energy than the nanocrystals 22 by altering the physical shape of at least one of the plurality of nanocrystals 20 and the plurality of nanocrystals 22. For example, the nanocrystals 20 may be generally spherical and the nanocrystals 22 may be non-spherical, such that the energy level structure thereof is altered.

Considering the above, the energy level structure of at least one of the nanocrystals 20 and the nanocrystals 22 may be configured such that the nanocrystals 20 exhibit a lower bandgap energy than the nanocrystals 22 by varying one or more of the average size, the chemical composition, and the shape of at least one of the nanocrystals 20 and the nanocrystals 22. Any other method for altering the energy level structure of a nanoparticle may be used to configure at least one of the nanocrystals 20 and the nanocrystals 22, such that the nanocrystals 20 exhibit lower bandgap energy than the nanocrystals 22.

Figure 3:
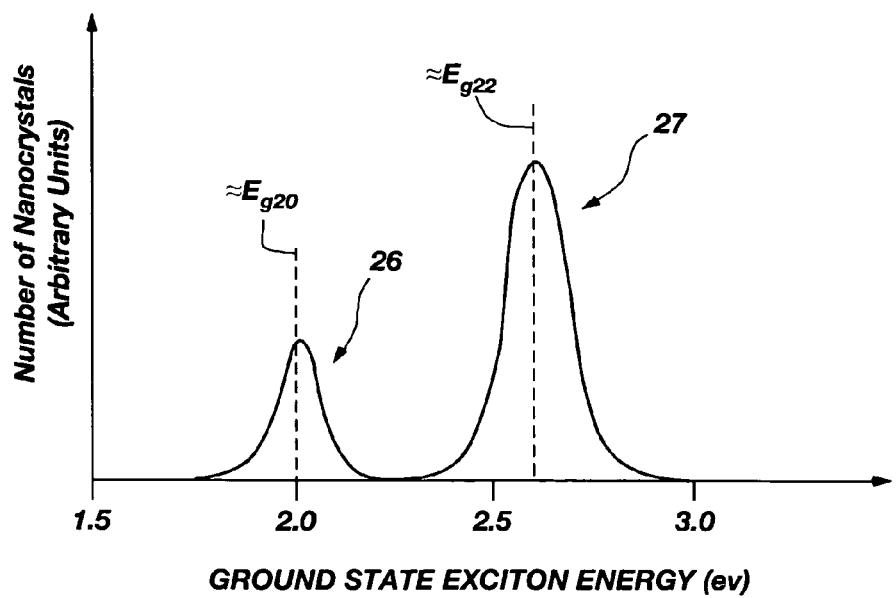
FIG. 3 is a graph illustrating an example of a multi-modal energy level distribution that may be exhibited by the nanocrystals included in the luminescent material shown in FIG. 1.

In this configuration, the plurality of nanocrystals 20, 22 may exhibit a multi-modal energy level distribution generally represented by the graph illustrated in FIG. 3. In the configuration represented in FIG. 3, the plurality of nanocrystals 20, 22 exhibit a bi-modal energy level distribution. As can be seen therein, the first plurality of nanoparticles 20 may exhibit a first energy level mode 26, and the second plurality of nanoparticles 22 may exhibit a second energy level mode 27. The peak of the first energy level mode 26 may correspond to, or be disposed proximate to, the ground state exciton energy of the first plurality of nanoparticles 20, and the peak of the second energy level mode 27 may correspond to, or be disposed proximate to, the ground state exciton energy of the second plurality of nanoparticles 22. As used herein, the term "ground state exciton energy" means the energy of the lowest energy state available for excitons (i.e., bound electron-hole pairs) in a particular nanocrystal. The ground state exciton energy may be approximately equal to, but slightly less than (due at least partially to the so-called "binding energy" of the exciton), the bandgap energy for the particular nanocrystal.

By way of example and not limitation, the first energy level mode 26 exhibited by the first plurality of nanoparticles 20 may be generally disposed at about 2.00 eV, and the second energy level mode 27 exhibited by the second plurality of nanoparticles may be generally disposed at about 2.53 eV. In additional embodiments of the present invention, the first energy level mode 26 and the second energy level mode 27 may be disposed at any energy level, and the plurality of nanocrystals 20, 22 may exhibit any number of energy level modes, as discussed in further detail below.

In some embodiments, the luminescent material 12 may include between about 50 percent and about 99 percent by volume of high energy nanocrystals and between about 1 percent and about 50 percent by volume low energy nanocrystals.

As can be seen by combined reference to FIGS. 1 and 3, in some of embodiments of the present invention, the number of nanocrystals 22 may be greater than the number of nanocrystals 20 in the luminescent material 12, as will also be described in further detail below.

As the nanocrystals 20 have a lower bandgap energy (and lower ground state exciton energy) relative to the nanocrystals 22, the first plurality of nanocrystals 20 will be referred to hereinafter as "low energy nanocrystals," and the second plurality of nanocrystals 22 will be referred to hereinafter as "high energy nanocrystals." It is understood that these terms merely indicate that the nanocrystals 20 exhibit a bandgap energy (and ground state exciton energy) that is lower than a bandgap energy (and ground state exciton energy) exhibited by the nanocrystals 22.

By way of example and not limitation, the low energy nanocrystals 20 and the high energy nanocrystals 22 may each comprise any Ill-V type semiconductor material or any II-VI type semiconductor material. For example, the low energy nanocrystals 20 and the high energy nanocrystals 22 may each include GaAs, InP, GaP, GaN, AlN, $Al_xGa_{1-x}As$ (where x is in a range extending from about 0 to about 0.4), $In_{1-x}Ga_xAs_{1-y}P_y$ (where x is in a range extending from about 0 to about 0.47 and y is equal to about 2.2 times x), InGaN alloys, $In_{0.49}Al_xGa_{0.51-x}P$, $GaAs_{1-y}P_y$ (where y is less than about 0.45), $GaAs_{1-y}P_y$ doped with N, Zn, or O (where y is greater than about 0.45), GaP doped with Zn or 0, GaP doped with N, ZnO, ZnS, CdS, CdSe, and ternary or quaternary alloys or compounds of Cd, Zn, Se, and S. Furthermore, as previously described herein, the chemical composition of the low energy nanocrystals 20 may be substantially identical to, or different from, the chemical composition of the high energy nanocrystals 22.

Figure 4:
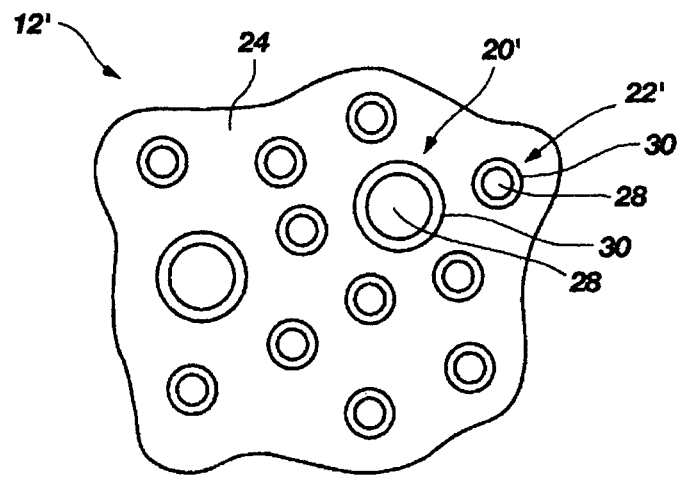
FIG. 4 is a partial view of another embodiment of a luminescent material that may be used in a light-emitting diode such as that shown in FIG. 1.

A portion of another luminescent material 12' that may be used in the light-emitting diode 10 shown in FIG. 1 is illustrated in FIG. 4. As shown therein, the luminescent material 12' may include a plurality of low energy nanocrystals 20' and a plurality of high energy nanocrystals 22' similar to those previously described herein in relation to FIG. 1. Moreover, at least some of the low energy nanocrystals 20' and the high energy nanocrystals 22' may include a core-shell structure as illustrated in FIG. 4. For example, the low energy nanocrystals 20' and the high energy nanocrystals 22' may each comprise a core region 28 and a shell region 30. By way of example and not limitation, the core region 28 of each low energy nanocrystal 20' and each high energy nanocrystal 22' may include CdSe, and the shell region 30 of each low energy nanocrystal 20' and each high energy nanocrystal 22' may include ZnS. Such nanocrystals are known in the art and commercially available from, for example, Evident Technologies of Troy, N.Y. Various other materials may be used for the core region 28 in addition to CdSe, and various other materials may be used for the shell region 30 in addition to ZnS.

Surface defects and trapped charges in the crystal structure of nanocrystals, such as the low energy nanocrystals 20' and the high energy nanocrystals 22', may contribute to non-radiative recombination of exciton electron-hole pairs (i.e., without emitting a photon upon recombination) in the nanocrystals. The shell region 30 may passivate the surface of the low energy nanocrystals 20' and the high energy nanocrystals 22'. In other words, the core-shell configuration of the low energy nanocrystals 20'. and the high energy nanocrystals 22' illustrated in FIG. 4 may reduce the number of exciton electron-hole pairs that recombine in a non-radiative manner, which may enhance the luminescence efficiency of the luminescent material 12'.

Figure 5:
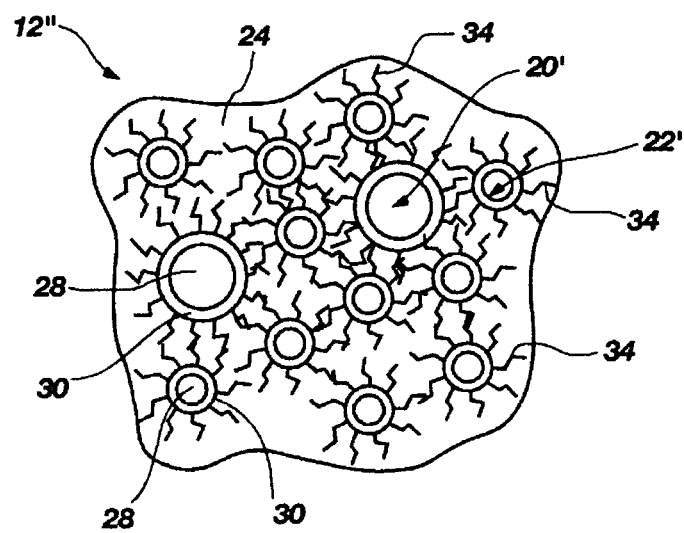
FIG. 5 is a partial view of yet another embodiment of a luminescent material that may be used in a light-emitting diode such as that shown in FIG. 1.

A portion of yet another luminescent material 12" that may be used in the light-emitting diode 10 shown in FIG. 1 is illustrated in FIG. 5. As shown therein, the luminescent material 12" may include a plurality of low energy nanocrystals 20' and a plurality of high energy nanocrystals 22', as previously described in relation to FIG. 4. The luminescent material 12", however, may also include a plurality of organic ligands 34 disposed on exterior surfaces of at least some of the low energy nanocrystals 20' and the high energy nanocrystals 22'. By way of example and not limitation, the organic ligands 34 may include one of tri-octyl phosphine (TOP), tri-octyl phosphine oxide (TOPO), alkyl chains terminated with amines or other functional groups, and alkyl or aryl derivatives of carbodithioic acids.

The organic ligands 34 may be configured to further passivate the surface of the low energy nanocrystals 20' and the high energy nanocrystals 22' so as to reduce the number of exciton electron-hole pairs that recombine in a non-radiative manner, as previously described in relation to the shell region 30 of the low energy nanocrystals 20' and the high energy nanocrystals 22'. Furthermore, the organic ligands 34 may be configured to prevent agglomeration of the low energy nanocrystals 20' and the high energy nanocrystals 22' in the polymer material 24, which may facilitate fabrication of the luminescent material 12" and contribute to enhancement of the luminescence efficiency of the luminescent material 12". Moreover, the organic ligands 34 may be configured to both passivate the surface of the low energy nanocrystals 20' and the high energy nanocrystals 22' and prevent agglomeration of the low energy nanocrystals 20' and the high energy nanocrystals 22'.

In other embodiments, the luminescent material 12" may include low energy nanocrystals and the high energy nanocrystals that do not have a core-shell structure, such as the low energy nanocrystals 20 and the high energy nanocrystals 22 previously described in relation to FIG. 1. In other words, luminescent materials that embody teachings of the present invention may include organic ligands disposed on exterior surfaces of any type of nanocrystal.

Referring again to FIG. 1, the low energy nanocrystals 20 may exhibit a lower bandgap energy relative to the high energy nanocrystals 22, as previously described. In some embodiments, the plurality of low energy nanocrystals 20 and the plurality of high energy nanocrystals 22 may each include a luminescent material.

Figure 6:
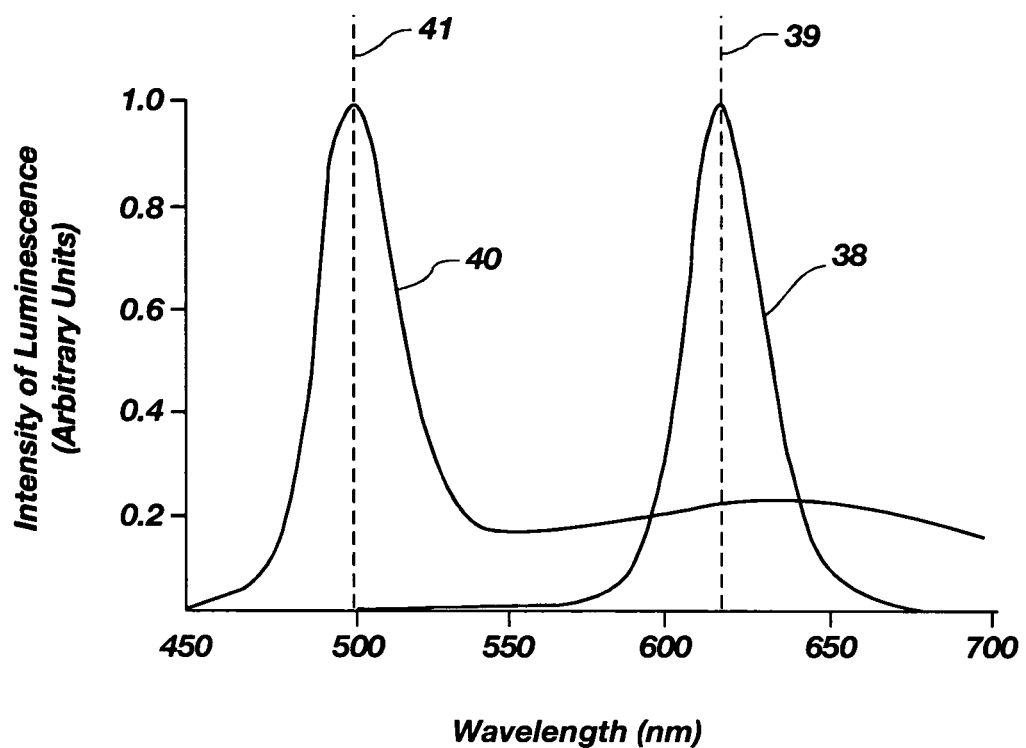
FIG. 6 is a graph illustrating a bi-modal emission spectrum that may be exhibited by the nanocrystals in the luminescent material shown in FIG. 1.

Due at least in part to the lower bandgap energy of the low energy nanocrystals 20 relative to the high energy nanocrystals 22, the wavelengths of electromagnetic radiation that may be emitted by the low energy nanocrystals 20 may be shifted relative to the wavelengths of electromagnetic radiation that may be emitted by the high energy nanocrystals 22. FIG. 6 is a simplified graph representing an example of an emission spectrum that may be exhibited by the luminescent material 12. An emission spectrum is a graph illustrating the intensity of luminescence as a function of wavelength. As seen in FIG. 6, an emission spectrum 38 of the low energy nanocrystals 20 may be shifted relative to an emission spectrum 40 of the high energy nanocrystals 22.

By way of example and not limitation, the low energy nanocrystals 20 may be configured to emit electromagnetic radiation (upon stimulation) over a range of wavelengths extending from about 580 nanometers to about 660 nanometers, and may be configured to emit a peak wavelength 39 of about 620 nanometers. This range of wavelengths may comprise wavelengths in the visible red light region of the electromagnetic spectrum. Furthermore, the high energy nanocrystals 22 may be configured to emit electromagnetic radiation (upon stimulation) over a range of wavelengths extending from about 450 nanometers to about 530 nanometers, and may be configured to emit a peak wavelength 41 of about 490 nanometers. This range of wavelengths may comprise wavelengths in the visible blue light region of the electromagnetic spectrum. In this configuration, the emission spectrum 38 of the low energy nanocrystals 20 may be shifted to longer wavelengths by about roughly 130 nanometers.

Moreover, while the peak of the emission spectrum 38 of the low energy nanocrystals 20 and the peak of the emission spectrum 40 of the high energy nanocrystals 22 are illustrated in FIG. 6 as being of about equal intensities, the present invention is not so limited. In additional embodiments, the emission spectrum 40 of the high energy nanocrystals 22 may have an intensity that is much lower than that of the emission spectrum 38 of the low energy nanocrystals 20 over a particular range of wavelengths of interest. For example, the emission spectrum 40 of the high energy nanocrystals 22 may have a total intensity (i.e, the total area under the emission spectrum curve 40) in a range from about zero percent to about one-hundred percent or more of the total intensity of the emission spectrum 38 over a particular range of wavelengths of interest (e.g., from about 450 nanometers to about 700 nanometers, as shown in FIG. 6).

Figure 7:
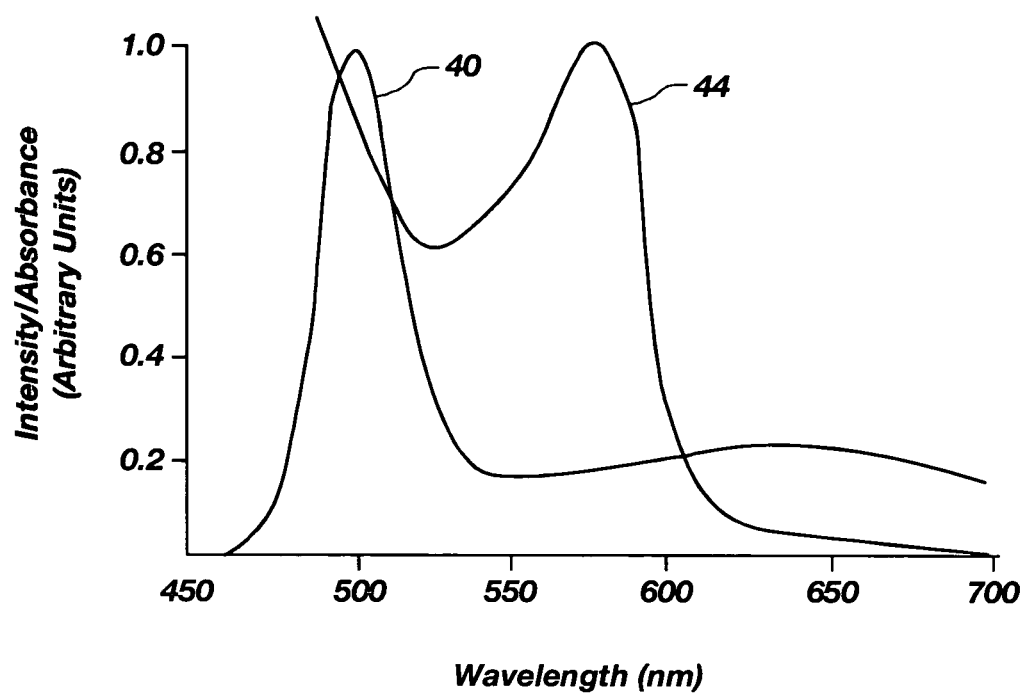
FIG. 7 is a graph illustrating overlap between an emission spectrum that may be exhibited by a first plurality of nanocrystals in the luminescent material shown in FIG. 1, and an absorption spectrum that may be exhibited by an additional plurality of luminescent nanocrystals in the luminescent material shown in FIG. 1.

FIG. 7 shows a graph superimposing an emission spectrum 40 that may be exhibited by the high energy nanocrystals 22 with an absorption spectrum 44 of the low energy nanocrystals 20. An absorption spectrum is a graph illustrating the ability of a material to absorb electromagnetic radiation as a function of wavelength. As seen in FIG. 7, the low energy nanocrystals 20 may be configured to absorb varying amounts of electromagnetic radiation having wavelengths shorter than about 600 nanometers, but may not be capable of absorbing significant amounts of electromagnetic radiation at wavelengths longer than about 600 nanometers.

As seen in FIG. 7, the emission spectrum 40 of the high energy nanocrystals 22 may overlap with at least a portion of the absorption spectrum 44 of the low energy nanocrystals 22. In other words, the high energy nanocrystals 22 may be configured to emit electromagnetic radiation over a range of wavelengths, at least a portion of which may be absorbed by the low energy nanocrystals 20. As known in the art, an "overlap integral" may be defined as the integral of either the product of the emission spectrum 40 of the high energy nanocrystals 22 and the absorption spectrum 44 of the low energy nanocrystals 22 (or the integral of a function that is proportional to the product of the emission spectrum 40 of the high energy nanocrystals 22 and the absorption spectrum 44 of the low energy nanocrystals 22). In other words, the overlap integral may be defined as the area in a graph under the curve produced by multiplying the emission spectrum 40 of the high energy nanocrystals 22 and the absorption spectrum 44 of the low energy nanocrystals 22 (or a curve proportional to the product of the emission spectrum 40 and the absorption spectrum 44). In some embodiments of the present invention, the luminescent material 12 may be configured to maximize or otherwise optimize the overlap integral.

In such a configuration, the luminescent material 12 may facilitate or promote the transfer of excitons originating in the polymer material towards the low energy nanocrystals 20. In this manner, the high energy nanocrystals 22 may behave as energy "collectors" or energy "antennae" for the low energy nanocrystals 20, and the luminescent material 12 itself may function as a sort of luminescent system.

In this manner, the luminescent material 12 may be configured such that non-radiative resonant energy transfer from the high energy nanocrystals 22 to the low energy nanocrystals 20 is maximized or otherwise optimized. This may be achieved by optimizing the overlap integral, as discussed above. It is contemplated that the luminescent material 12 may also be configured such that radiative energy transfer from the high energy nanocrystals 22 to the low energy nanocrystals 20 is maximized or otherwise optimized. In other words, the luminescent material 12 may be configured such that some photons of electromagnetic radiation emitted by the high energy nanocrystals 22 (upon stimulation) are capable of being absorbed by the low energy nanocrystals 20. In some embodiments, the luminescent material 12 may be configured such that a majority to substantially all of the electromagnetic radiation emitted by the luminescent material 12 is emitted from the low energy nanocrystals 20.

As described in further detail below, the luminescent material 12 may also be configured such that non-radiative resonant energy transfer between the low energy nanocrystals 20 is reduced or minimized, such that non-radiative resonant energy transfer between the high energy nanocrystals 22 is reduced or minimized, or such that non-radiative resonant energy transfer between the low energy nanocrystals 20 and between the high energy nanocrystals 22 is reduced or minimized.

As previously discussed herein, a fraction of the nanocrystals 20, 22 may include surface defects, trapped charges, or other features or characteristics that promote the non-radiative recombination of excitons. These "bad" nanocrystals 20, 22 may detrimentally affect the luminescence efficiency of the luminescent material 12. Therefore, to maximize or otherwise optimize the luminescence efficiency of the luminescent material 12, it may be desirable to promote or facilitate rapid transfer of excitons to a low energy nanocrystal 20, while preventing or minimizing transfer of excitons between low energy nanocrystals 20 so as to prevent or minimize the transfer of excitons to "bad" low energy nanocrystals 20.

Non-radiative resonant energy transfer of an exciton from low energy nanocrystals 20 to high energy nanocrystals 22 generally does not occur because such a transfer typically requires an increase in the energy of the exciton. Therefore, to prevent transfer of excitons from the low energy nanocrystals 20 by non-radiative resonant energy transfer mechanisms, it may be sufficient to prevent transfer occurring directly between low energy nanocrystals 20.

If the density of the high energy nanocrystals 22 in the luminescent material 12 is relatively high compared to the density of the low energy nanocrystals 20 in the luminescent material 12, the average spacing between low energy nanocrystals 20 may be large enough to significantly reduce the occurrence of non-radiative resonant energy transfer between low energy nanocrystals 20. In this configuration, the low energy nanocrystals 20 may effectively behave as potential energy wells that collect and trap excitons where they may recombine and emit electromagnetic radiation. Such a configuration may be particularly beneficial in applications in which nanocrystals tend to cluster together (for example, due to immiscibility in an organic host material). In the absence of the high energy nanocrystals 22, the low energy nanocrystals 20 might pack together in close proximity, which may result in rapid energy transfer between nanocrystals and, therefore, diffusion of excitons to so-called bad nanocrystals. In this configuration, the luminescent material 12 may be configured to prevent transfer of excitons away from the low energy nanocrystals 20, which may improve the luminescence efficiency of the low energy nanocrystals 20.

Figure 8:
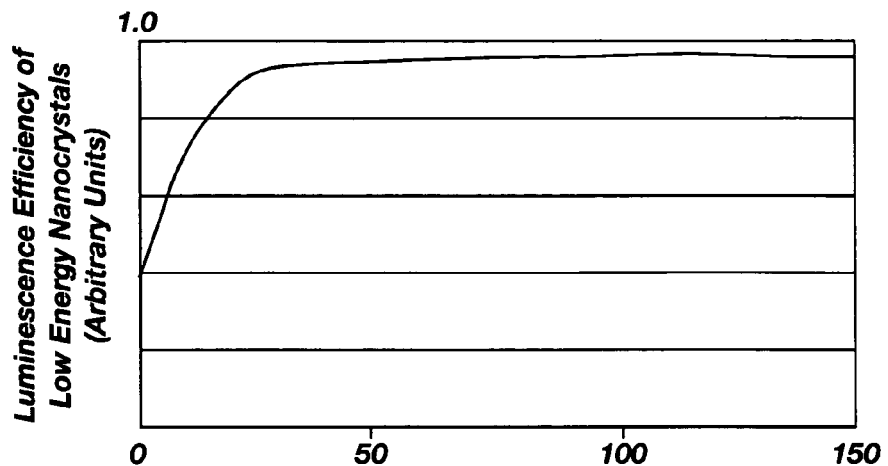
FIG. 8 is a graph illustrating a potential relationship between the ratio of the number of high energy nanocrystals to the number of low energy nanocrystals in a luminescent material, and the luminescence efficiency of the low energy nanocrystals.

FIG. 8 shows a graph generally representing a relationship between the luminescence efficiency of the low energy nanocrystals 20 as a function of the ratio of the number of high energy nanocrystals 22 to the number of low energy nanocrystals 20, which may be exhibited by the luminescent material 12 shown in FIG. 1. In FIG. 8, it is assumed that the high energy nanocrystals 22 and the low energy nanocrystals 20 each have an average particle size (e.g., average diameter of a generally spherical particle) of less than about twenty nanometers. As seen in FIG. 8, the luminescence efficiency of the low energy nanocrystals 20 may increase relatively rapidly as the ratio is increased from 1 to about 25. As the ratio increases above about 25, the luminescence efficiency of the low energy nanocrystals 20 may reach a maximum that is retained as the ratio increases up to 150. Therefore, in some embodiments of the present invention, the plurality of low energy nanocrystals 20 and the plurality of high energy nanocrystals 22 each have an average particle size of less than about twenty nanometers, and the ratio of the number of high energy nanocrystals 22 to the number of low energy nanocrystals 20 may be greater than 1. In additional embodiments, the ratio of the number of high energy nanocrystals 22 to the number of low energy nanocrystals 20 may be greater than about 10. In still further embodiments, the ratio of the number of high energy nanocrystals 22 to the number of low energy nanocrystals 20 may be greater than about 25.

By selectively tailoring the distribution of the nanocrystals 20, 22 in the material 24, the luminescent material 12 may be configured such that non-radiative resonant energy transfer between the low energy nanocrystals 20 is reduced or minimized, such that non-radiative resonant energy transfer between the high energy nanocrystals 22 is reduced or minimized, or such that non-radiative resonant energy transfer between the low energy nanocrystals 20 and between the high energy nanocrystals 22 is reduced or minimized. By reducing or minimizing such non-radiative resonant energy transfer, the luminescence efficiency of the low energy nanocrystals 20, which exhibit one energy level mode of the multi-modal energy level distribution of the nanocrystals 20, 22, may be maximized or otherwise optimized.

Luminescent materials that embody teachings of the present invention (such as, for example, the luminescent material 12 shown in FIG. 1, the luminescent material 12' shown in FIG. 4, and the luminescent material 12" shown in FIG. 5) are not limited to including only two pluralities of nanocrystals so as to exhibit a bi-modal energy level distribution, but may include any number of pluralities of nanocrystals so as to exhibit an energy level distribution having any number of modes. For example, the luminescent material 12 optionally may include at least one additional plurality of nanocrystals exhibiting an emission spectrum that is shifted in wavelength relative to both the emission spectrum 38 (FIG. 6) of the low energy nanocrystals 20 and the emission spectrum 40 (FIG. 6) of the high energy nanocrystals 22.

Figure 9:
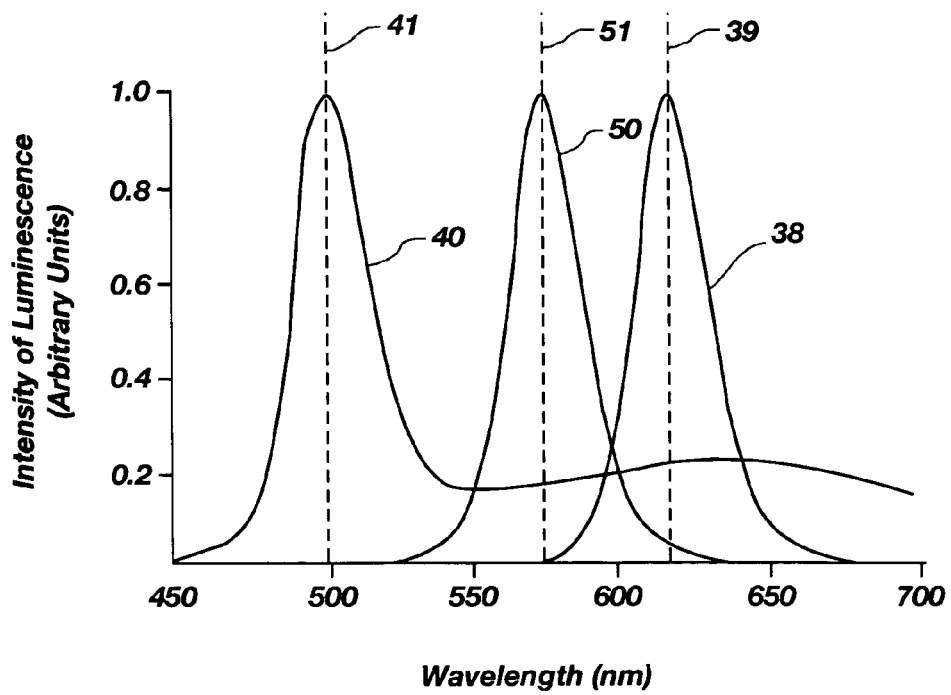
FIG. 9 is a graph illustrating a tri-modal emission spectrum that may be exhibited by nanocrystals in a luminescent material that embodies teachings of the present invention.

Referring to both FIG. 1 and FIG. 9, by way of example and not limitation, the luminescent material 12 may include a third plurality of nanocrystals (not shown), which may be configured to emit electromagnetic radiation (upon stimulation) over a range of wavelengths extending from about 530 nanometers to about 590 nanometers, and may be configured to emit a peak wavelength 51 of about 560 nanometers. This range of wavelengths may comprise wavelengths in the visible yellow light region of the electromagnetic spectrum. By providing any desired number of different "sets" or pluralities of nanocrystals, and selectively tailoring their respective bandgap energies (and ground state exciton energies) and relative concentrations in the luminescent material 12, it may be possible to selectively optimize the collection of excitons generated in the material 24 and their transfer to relatively low energy nanocrystals (such as the low energy nanocrystals 20), all while minimizing the probability that a given exciton will encounter a "bad" nanocrystal and non-radiatively recombine. In this manner, the luminescence efficiency of the luminescent material 12 may be maximized or otherwise optimized.

Furthermore, if the luminescent material 12 is a photoluminescent material and is used in a photoluminescent device as opposed to the light-emitting diode 10 (as shown in FIG. 1), by providing any desired number of different "sets" or pluralities of nanocrystals, and selectively tailoring their respective bandgap energies and relative concentrations in the luminescent material 12, it may be possible to selectively tailor the photoluminescent material 12 to be optically stimulated to generate excitons at a selected wavelength or over a selected range of wavelengths with an optimum or maximum efficiency, and to further selectively tailor the luminescent material 12 to emit electromagnetic radiation upon such optical stimulation at a different selected wavelength or range of wavelengths with optimum or maximum efficiency. Such luminescent materials 12 may be used, for example, as color-converting phosphor materials.

Luminescent materials that embody teachings of the present invention (such as, for example, the luminescent material 12 shown in FIG. 1, the luminescent material 12' shown in FIG. 4, and the luminescent material 12" shown in FIG. 5) may be used to improve the effective photoluminescence or electroluminescence efficiency of any device (in addition to light-emitting diodes) that utilizes luminescent nanocrystals that are spaced close enough to one another to allow inter-particle exciton transfer. By way of example and not limitation, sensors configured to detect electromagnetic radiation may include luminescent materials that embody teachings of the present invention.

Moreover, a number of electronic devices include light-emitting diodes and may embody teachings of the present invention. By way of example and not limitation, televisions, computer monitors, laptop computers, handheld computers, portable DVD players, digital music players, and other portable electronic devices all may include display devices that include luminescent materials or light-emitting diodes that embody teachings of the present invention.

Figure 10A:
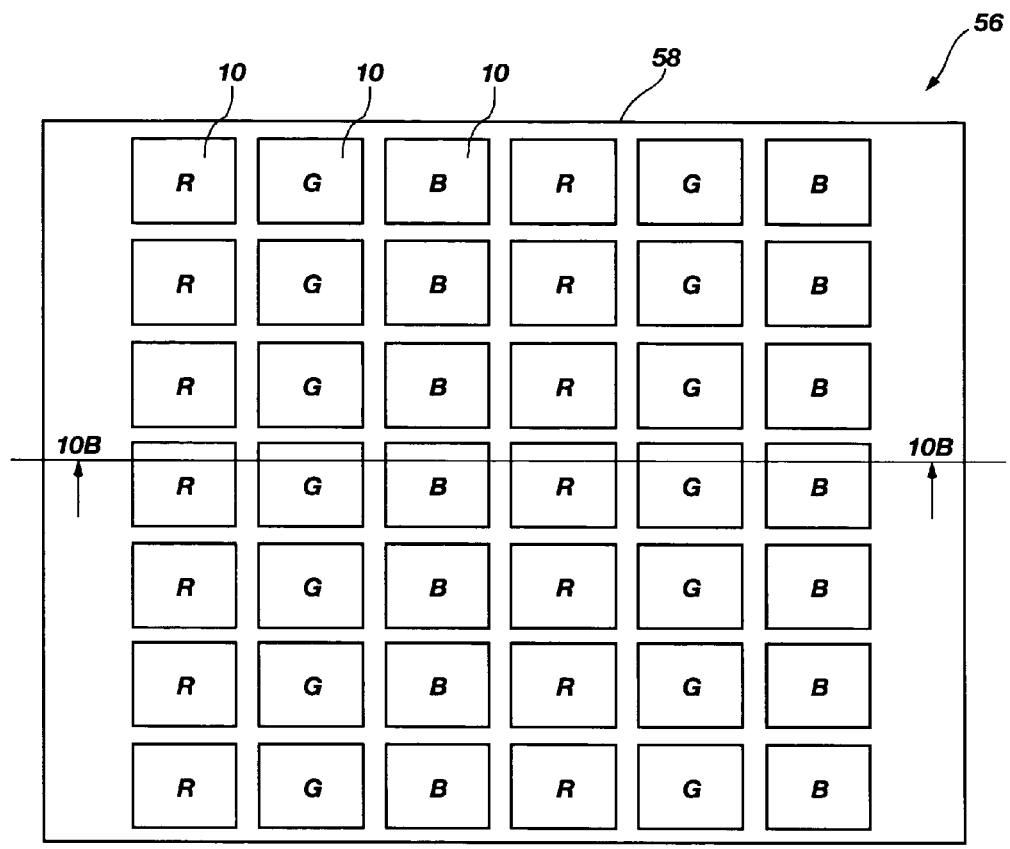
FIGS. 10A-10B illustrate schematically a display device that includes a plurality of light-emitting diodes such as that shown in FIG. 1, and which may be used in electronic devices that embody teachings of the present invention.
Figure 10B:
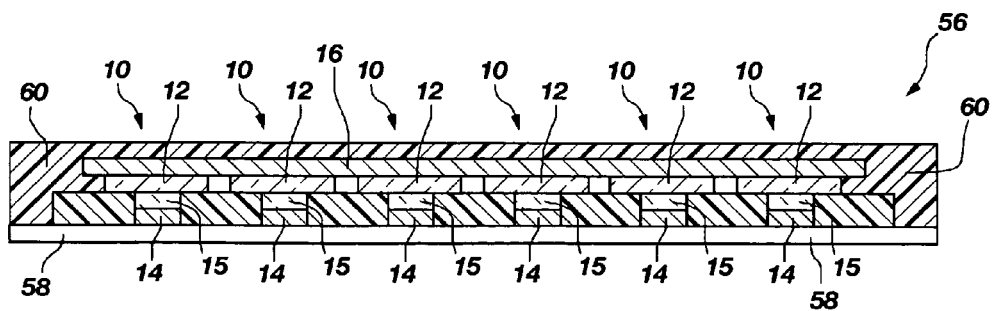

FIGS. 10A and 10B illustrate an example of a display device 56 that embodies teachings of the present invention. As shown in FIG. 10A, the display device 56 may include a plurality of individual light-emitting diodes 10, as previously described in relation to FIG. 1. The light-emitting diodes 10 may be disposed in an ordered array or matrix on a substrate 58. By way of example and not limitation, the light-emitting diodes 10 may be disposed in a plurality of rows and columns, as illustrated in FIG. 10A. Furthermore, some of the light-emitting diodes 10 may be configured to emit electromagnetic radiation in the visible red light region of the electromagnetic spectrum (such light-emitting diode's are labeled in FIG. 10A with an "R"), some of the light-emitting diodes 10 may be configured to emit electromagnetic radiation in the visible green light region of the electromagnetic spectrum (such light-emitting diode's are labeled in FIG. 10A with an "G"), and some of the light-emitting diodes 10 may be configured to emit electromagnetic radiation in the visible blue light region of the electromagnetic spectrum (such light-emitting diode's are labeled in FIG. 10A with an "B").

For example, the light-emitting diodes 10 configured to emit red light may include low energy nanocrystals 20 that are configured to emit a peak wavelength of electromagnetic radiation at a wavelength in a range extending from about 620 nanometers to about 680 nanometers, the light-emitting diodes 10 configured to emit green light may include low energy nanocrystals 20 that are configured to emit a peak wavelength of electromagnetic radiation at a wavelength in a range extending from about 500 nanometers to about 550 nanometers, and the light-emitting diodes 10 configured to emit blue light may include low energy nanocrystals 20 that are configured to emit a peak wavelength of electromagnetic radiation at a wavelength in a range extending from about 450 nanometers to about 500 nanometers.

Each of the light-emitting diodes 10, or individual groups or clusters of light-emitting diodes 10, may be individually addressable by a separate electrical driving circuit. The light-emitting diodes 10 together may define the "screen" of the display device. In this configuration, an electronic signal processor may be configured to display images visible to a person using the display device 56 and an electrical driving circuit.

Referring to FIG. 10B, each light-emitting diode 10 of the display device 56 may include an anode 14, a cathode 16, and a luminescent material 12 that embodies teachings of the present invention disposed between the anode 14 and the cathode 16.

In some embodiments, each anode 14 may be substantially elongated and common to one row or column of light-emitting diodes 10. Similarly, each cathode 16 may be substantially elongated and common to one row or column of light-emitting diodes. The anodes 14 may extend in a generally perpendicular direction relative to the cathodes 16. In this configuration, each individual light-emitting diode 10 may be selectively addressable using a selected anode 14 and a selected cathode 16 (i.e., a selected row and column). In this configuration, the display device 56 may be configured as a "passive matrix" display device.

In additional embodiments, the display device 56 may be configured as an "active matrix" display device. Various configurations of active matrix and passive matrix display devices are known in the art and may embody teachings of the present invention.

As shown in FIG. 10B, the display device 56 may further include a coating 60 or other protective layer that, together with the substrate 58, may be configured to encapsulate and protect the individual light-emitting diodes 10 of the display device. At least one of the substrate 58 and the coating 60 may be optically transparent such that visible light emitted by the light-emitting diodes 10 may be visible to a person viewing the display device 56.

The present invention is not limited to display devices having configurations substantially as shown in FIGS. 10A and 10B. Many configurations of light-emitting diode display devices are known in the art. The luminescent efficiency of the light-emitting diodes of any such display device may be enhanced by using luminescent materials as previously described herein, and therefore, may embody teachings of the present invention.

Although the luminescent materials have been previously described herein as including luminescent nanocrystals, the luminescent materials also may include luminescent nanoparticles that include a non-crystalline luminescent material. Such non-crystalline luminescent materials may include, for example, amorphous luminescent polymer materials, luminescent proteins (such as, for example, the protein commonly referred to as Green Fluorescent Protein (GFP)), or amorphous inorganic alloys (such as, for example, nitrides of Group III of the periodic table of the elements (e.g., AlN, BN, etc.) doped with one or more rare earth elements (e.g., erbium, europium, and/or terbium), silicon, germanium, hydrogenated amorphous Si or Ge, Si or Ge doped with one or more rare-earth elements, and oxides of rare-earth elements (e.g., erbium oxide)).

The luminescent materials described herein may be photoluminescent, electroluminescent, or both photoluminescent and electroluminescent. As such, any photoluminescent or electroluminescent device may include a luminescent material as described herein, and may embody teachings of the present invention. Furthermore, electroluminescent devices need not include a diode to embody teachings of the present invention, and other types of electroluminescent devices may also embody teachings of the present invention. Such electroluminescent devices may include, for example, light-emitting transistors and thin-film electroluminescent devices.

Although the foregoing description contains many specifics, these are not to be construed as limiting the scope of the present invention, but merely as providing certain representative embodiments. Similarly, other embodiments of the invention can be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims, are encompassed by the present invention.

What is claimed is:

1. A luminescent device comprising:
a luminescent material; and
a plurality of nanocrystals dispersed throughout the material, at least one nanocrystal of the plurality of nanocrystals being configured to emit electromagnetic radiation upon stimulation, the plurality of nanocrystals exhibiting a multi-modal energy level distribution, wherein the distribution of the nanocrystals in the material is selectively configured to enhance the luminescence efficiency of a fraction of the plurality of nanocrystals that exhibits one energy level mode of the multi-modal energy level distribution, wherein the nanocrystals of the plurality of nanocrystals have an average particle size of less than about twenty nanometers.

2. The luminescent device comprises:
a luminescent material; and
a plurality of nanocrystals dispersed throughout the material, at least one nanocrystal of the plurality of nanocrystals being configured to emit electromagnetic radiation upon stimulation, the plurality of nanocrystals exhibiting a multi-modal energy level distribution, wherein the distribution of the nanocrystals in the material is selectively configured to enhance the luminescence efficiency of a fraction of the plurality of nanocrystals that exhibits one energy level mode of the multi-modal energy level distribution,
wherein the plurality of nanocrystals comprises:
a plurality of high energy nanocrystals; and
a plurality of low energy nanocrystals; and
wherein the ratio of the number of high energy nanocrystals in the luminescent material to the number of low energy nanocrystals in the luminescent material is greater than 10.

3. The luminescent material device comprising:
a luminescent material; and
a plurality of nanocrystals dispersed throughout the material, at least one nanocrystal of the plurality of nanocrystals being configured to emit electromagnetic radiation upon stimulation, the plurality of nanocrystals exhibiting a multi-modal energy level distribution, wherein the distribution of the nanocrystals in the material is selectively configured to enhance the luminescence efficiency of a fraction of the plurality of nanocrystals that exhibits one energy level mode of the multi-modal energy level distribution,
wherein the plurality of nanocrystals comprises:
a plurality of high energy nanocrystals; and
a plurality of low energy nanocrystals, wherein the ratio of the number of high energy nanocrystals in said luminescent material to the number of low energy nanocrystals in said luminescent material is greater than about 1, and
wherein the high energy nanocrystals have an average particle size that is different from an average particle size of the low energy nanocrystals.

4. The luminescent device of claim 3, wherein the high energy nanocrystals are generally spherical and have an average diameter in a range extending from about 1 to about 10 nanometers, and wherein the low energy nanocrystals are generally spherical and have an average diameter in a range extending from about 2 to about 20 nanometers.

5. The luminescent device comprising:
a luminescent material; and
a plurality of nanocrystals dispersed throughout the material, at least one nanocrystal of the plurality of nanocrystals being configured to emit electromagnetic radiation upon stimulation, the plurality of nanocrystals exhibiting a multi-modal energy level distribution, wherein the distribution to the nanocrystals in the material is selectively configured to enhance the luminescence efficiency of a fraction of the plurality of nanocrystals that exhibits one energy level mode of the multi-modal energy level distribution, wherein the luminescent material is configured to emit electromagnetic radiation therefrom when an electrical field is applied across the luminescent material.

6. The luminescent device comprising:
a luminescent material; and
a plurality of nanocrystals dispersed throughout the material, at least one nanocrystal of the plurality of nanocrystals being configured to emit electromagnetic radiation upon stimulation, the plurality of nanocrystals exhibiting a multi-modal energy level distribution, wherein the distribution of the nanocrystals in the material is selectively configured to enhance the luminescence efficiency of a fraction of the plurality of nanocrystals that exhibits one energy level mode of the multimodal energy level distribution, wherein the average distance between adjacent nanocrystals in the luminescent material is between about 0.1 nanometers and about 50 nanometers.

7. A luminescent structure for emitting monomodal light having a characteristic wavelength range, said structure comprising:
 a luminescent material;
 a first plurality of nanoparticles distributed in said luminescent material and characterized by a first bandgap energy corresponding to said characteristic wavelength range; and
 a second plurality of nanoparticles distributed in said luminescent material, said second plurality of nanoparticles being characterized by a second bandgap energy greater than said first bandgap energy, said first and second pluralities of nanoparticles being distributed so as to establish a minimum average spacing of said first plurality of nanoparticles that limits resonant energy transfers among said first plurality of nanoparticles.

8. A luminescent structure as recited in claim 7 wherein said first plurality of nanoparticles includes either a III-V compound or a II-VI compound, and said second plurality of nanoparticles includes the same compound.

9. A luminescent structure as recited in claim 7 wherein said first plurality of nanoparticles has a first number of nanoparticles, and said second plurality of nanoparticles has a second number of nanoparticles, said second number being greater than said first number.

10. A luminescent structure as recited in claim 7 wherein said second plurality of nanoparticles promotes the transfer of excitons to said first plurality of nanoparticles.

11. A method of emitting monomodal light of a characteristic wavelength range, said method comprising:
 forming a luminescent structure in which some inorganic nanoparticles are clustered together in a luminescent organic material;
 combining excitons in a first plurality of said nanoparticles exhibiting a first bandgap energy corresponding to said characteristic wavelength range so as to emit light in said characteristic wavelength range; and
 limiting resonant energy transfers among said first plurality of nanoparticles, a second plurality of said nanoparticles exhibiting a second bandgap energy greater than said first bandgap energy.

12. A method as recited in claim 11 wherein said first plurality of nanoparticles includes either a III-V compound or a II-VI compound, and said second plurality of nanoparticles includes the same compound.

13. A method as recited in claim 11 wherein said first plurality of nanoparticles has a first number of nanoparticles, and said second plurality of nanoparticles has a second number of nanoparticles being greater than said first number.

14. A method as recited in claim 11 further comprising said second plurality of nanoparticles promoting the transfer of excitons to said first plurality of nanoparticles.

15. A light-emitting device for emitting electro-magnetic radiation predominantly in a characteristic wavelength range, said device comprising:
 luminescent material that, upon stimulation, emits source electro-magnetic radiation;
 relatively high-bandgap nanoparticles distributed with a first density through said luminescent material so as to absorb at least some of said source electro-magnetic radiation emitted by said luminescent material and to emit intermediate electro-magnetic radiation outside said characteristic wavelength range; and
 relatively low-bandgap nanoparticles distributed with a second density through said luminescent material so as to absorb electro-magnetic radiation emitted by said relatively high-bandgap nanoparticles and to emit final electro-magnetic radiation in said characteristic wavelength range;
 said first and second densities being co-selected so as to substantially maximize the luminescence efficiency of said device
  in part by promoting the transfer of energy from said luminescent material through said relatively high-bandgap nanoparticles to said relatively low-bandgap nanoparticles, and
  in part by limiting the transfer of energy between said relatively low-bandgap nanoparticles.

16. A light-emitting device as recited in claim 15 further comprising electrodes for use in applying an electrical field across said luminescent material to cause it to emit said relatively broad-range electro-magnetic radiation.

* * * * *

UNITED STATES PATENT AND TRADEMARK OFFICE
CERTIFICATE OF CORRECTION

PATENT NO.         : 8,884,511 B2
APPLICATION NO.    : 11/483479
DATED              : November 11, 2014
INVENTOR(S)        : Gary A. Gibson et al.

Page 1 of 1

It is certified that error appears in the above-identified patent and that said Letters Patent is hereby corrected as shown below:

In the Claims

In column 15, line 63, in Claim 2, delete "The" and insert -- A --, therefor.

In column 15, line 63, in Claim 2, delete "comprises:" and insert -- comprising: --, therefor.

In column 16, line 16, in Claim 3, delete "The" and insert -- A --, therefor.

In column 16, line 44, in Claim 5, delete "The" and insert -- A --, therefor.

In column 16, line 51, in Claim 5, delete "to" and insert -- of --, therefor.

In column 16, line 59, in Claim 6, delete "The" and insert -- A --, therefor.

Signed and Sealed this
Twenty-first Day of April, 2015

Michelle K. Lee
*Director of the United States Patent and Trademark Office*